(12) United States Patent  (10) Patent No.: US 7,937,631 B2
Vogelsang  (45) Date of Patent: May 3, 2011

(54) METHOD FOR SELF-TEST AND SELF-REPAIR IN A MULTI-CHIP PACKAGE ENVIRONMENT

(75) Inventor: Thomas Vogelsang, Jericho, VT (US)

(73) Assignee: Qimonda AG, Munich (DE)

( * ) Notice: Subject to any disclaimer, the term of this patent is extended or adjusted under 35 U.S.C. 154(b) by 594 days.

(21) Appl. No.: 11/846,482

(22) Filed: Aug. 28, 2007

(65) Prior Publication Data

US 2009/0063916 A1 Mar. 5, 2009

(51) Int. Cl.
*G11C 29/00* (2006.01)
(52) U.S. Cl. ........................................ 714/718; 714/733
(58) Field of Classification Search .................. 365/201; 714/718, 742, 723, 48, 727, 733
See application file for complete search history.

(56) References Cited

U.S. PATENT DOCUMENTS

| | | | | |
|---|---|---|---|---|
| 5,706,232 A | * | 1/1998 | McClure et al. | 365/201 |
| 6,256,240 B1 | * | 7/2001 | Shinozaki | 365/201 |
| 6,988,230 B2 | * | 1/2006 | Vermeulen et al. | 714/727 |
| 7,213,188 B2 | * | 5/2007 | Louie et al. | 714/742 |
| 7,565,586 B2 | * | 7/2009 | Thompson | 714/718 |
| 2007/0168780 A1 | * | 7/2007 | Janzen | 714/718 |

* cited by examiner

*Primary Examiner* — David Ton
(74) *Attorney, Agent, or Firm* — Patterson & Sheridan, LLP

(57) ABSTRACT

A method and apparatus for operating a component including a memory device. The method includes receiving a plurality of commands and determining if a set of the plurality of commands matches a predefined pattern of commands configured to place the memory device into a test mode. Upon determining that the set of the plurality of commands matches the predefined plurality of commands, the memory device is placed in the test mode.

27 Claims, 4 Drawing Sheets

METHOD FOR SELF-TEST AND SELF-REPAIR IN A MULTI-CHIP PACKAGE ENVIRONMENT

BACKGROUND OF THE INVENTION

Modern electronic devices typically include several integrated circuits which perform functions for the electronic devices. The integrated circuits may include one or more processors, volatile memory devices, non-volatile memory devices, and/or memory controllers. In some cases, to reduce the cost of an electronic device and simplify development and manufacturing of the electronic device, one or more of the integrated circuits within the electronic device may be placed in a multi-chip package. For example, where a processor in an electronic device accesses one or more memory circuits using a memory controller, the one or more memory circuits and/or the memory controller may be placed in a multi-chip package (MCP).

In order to ensure proper functioning of an electronic device, the integrated circuits within the electronic device may be subjected to one or more tests. Where integrated circuits within an electronic device are placed within a multi-chip package, accessing the integrated circuits within the multi-chip packages may be more difficult than accessing the integrated circuits alone. Because accessing the integrated circuits within the multi-chip package may be more difficult, testing of the integrated circuits within the multi-chip package may also be more difficult.

SUMMARY OF THE INVENTION

Embodiments of the invention generally provide a method and apparatus for operating a component including a memory device. The method includes receiving a plurality of commands and determining if a set of the plurality of commands matches a predefined pattern of commands configured to place the memory device into a test mode. Upon determining that the set of the plurality of commands matches the predefined plurality of commands, the memory device is placed in the test mode.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1A:
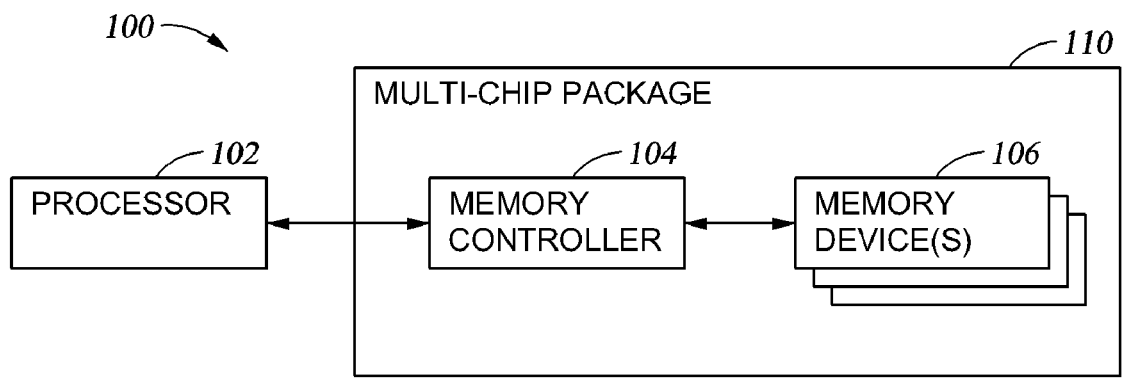
FIGS. 1A-B are block diagrams depicting a system according to embodiments of the invention.

Embodiments of the invention generally provide a method and apparatus for operating a component including a memory device. The method includes receiving a plurality of commands and determining if a set of the plurality of commands matches a predefined pattern of commands configured to place the memory device into a test mode. Upon determining that the set of the plurality of commands matches the predefined plurality of commands, the memory device is placed in the test mode. In some cases, by using commands issued to the memory device to activate a test mode of the memory device, activation of the test mode may be achieved, even where access to a test interface of the memory device is restricted. Furthermore, in some cases, by using standard commands to activate the test mode of the memory device, systems including the memory device may be designed and tested without requiring extensive and/or expensive modifications of devices (e.g., memory controllers and/or processors) which interact with the memory device to place the memory device in the test mode.

Embodiments of the invention may generally be used with any type of memory. In one embodiment, the memory may be a circuit included on a device with other types of circuits. For example, the memory may be integrated into a processor device, memory controller device, or other type of integrated circuit device. Devices into which the memory is integrated may include system-on-a-chip (SOC) devices. In another embodiment, the memory may be provided as a memory device which is used with a separate memory controller device or processor device.

In both situations, where the memory is integrated into a device with other circuits and where the memory is provided as a separate device, the memory may be used as part of a larger computer system. The computer system may include a motherboard, central processor, memory controller, the memory, a hard drive, graphics processor, peripherals, and any other devices which may be found in a computer system. The computer system may be part of a personal computer, a server computer, or a smaller system such as an embedded system, personal digital assistant (PDA), or mobile phone.

In some cases, a device including the memory may be packaged together with other devices, typically referred to as a multi-chip package. Devices within the multi-chip package may be connected via wire bonds or other types of connections to a circuit board with one or more layers of interconnections. The devices and the circuit board may be enclosed within a packaging material such as a molded encapsulant or a ceramic packaging material. Such packages may include any other types of devices, including other devices with the same type of memory, other devices with different types of memory, and/or other devices including processors and/or memory controllers. Also, in some cases, the memory may be included in a device mounted on a memory module. The memory module may include other devices including memories, a buffer chip device, and/or a controller chip device. The memory module may also be included in a larger system such as the systems described above.

In some cases, embodiments of the invention may be used with multiple types of memory or with a memory which is included on a device with multiple other types of memory. The memory types may include volatile memory and non-volatile memory. Volatile memories may include static random access memory (SRAM), pseudo-static random access memory (PSRAM), and dynamic random access memory (DRAM). DRAM types may include single data rate (SDR) DRAM, double data rate (DDR) DRAM, low power (LP) DDR DRAM, and any other types of DRAM. Nonvolatile memory types may include magnetic RAM (MRAM), flash memory, resistive RAM (RRAM), ferroelectric RAM (Fe-RAM), phase-change RAM (PRAM), electrically erasable programmable read-only memory (EEPROM), laser programmable fuses, electrically programmable fuses (e-fuses), and any other types of nonvolatile memory.

FIG. 1A is a block diagram depicting a system 100 including a multi-chip package 110 according to one embodiment of the invention. The system 100 may include a processor 102, memory controller 104, and one or more memory devices 106. The memory devices 106 may include one or more of any of the memory devices itemized above. In a particular embodiment, the memory devices 106 may include one or more volatile memories such as DRAM devices and/or one or more non-volatile memory devices.

As depicted, in one embodiment, the memory controller 104 and memory devices 106 may be placed together in a multi-chip package 110. In order to access the memory devices 106, the processor 102 may issue commands to the memory controller 104 via an interface of the multi-chip package 110 (e.g., physical connections for the memory controller 104 may be routed to the exterior of the multi-chip package 110 and the multi-chip package 110 may then be connected to the processor 102 via those physical connections). In one embodiment, an interface for accessing the memory devices 106 may not be exposed via the exterior of the multi-chip package 110 (e.g., physical connections for accessing the memory devices 106 may not be accessible directly via the exterior of the multi-chip package 110). Instead, for example, the memory devices 106 may be connected to the memory controller 104 within the package 110 and the memory controller interface may be exposed via the exterior of the package. The memory devices 106 may then be accessed indirectly via the memory controller 104. Optionally, only a portion of the interface for accessing the memory devices 106 may be exposed via the exterior of the multi-chip package 110.

Figure 1B:
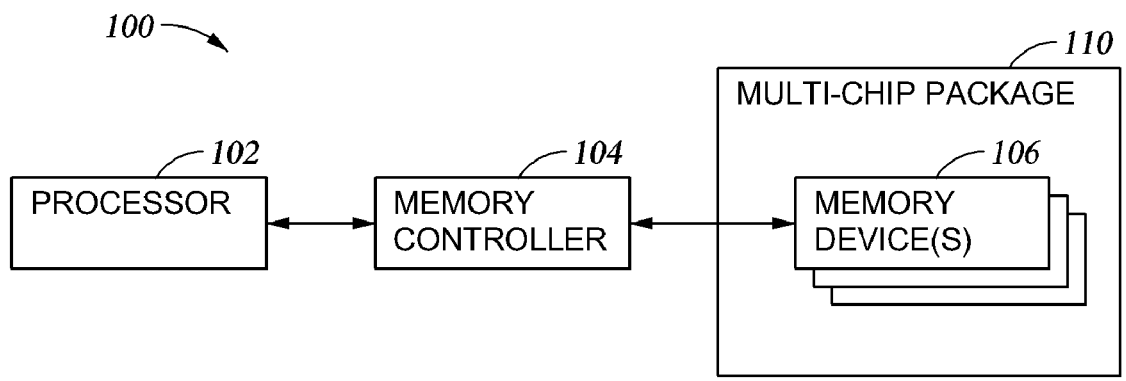

FIG. 1B is a block diagram depicting another arrangement of the system 100 according to one embodiment of the invention. As depicted, the system 100 may include a processor 102 and a memory controller 104 which are used to access memory devices 106 in a multi-chip package. For example, the multi-chip package 110 may provide multiple interfaces for each memory device 106 or, optionally, the package 110 may provide a single interface which is shared internally by the memory devices 106 (e.g., the memory devices 106 in the package 110 may share an address, control, and/or data bus).

As previously mentioned, after devices have been placed in the multi-chip package 110, access to the devices and testing of the devices may be more difficult. For example, in some cases, a device may include a test interface which is used to test the device. The test interface may provide test command inputs which may be used to place the device in a test mode and/or activate a built-in self test of the device. In some cases, where a device is placed in a multi-chip package 110, the test interface for the device may not be available (i.e., accessible). Accordingly, the multi-chip package may include extra connections for the test interface of the device within the package 110. However, the provision of such extra connections may increase the cost of the overall package. Thus, to reduce costs of the multi-chip package 110, an alternative embodiment of the package 110 may not include extra connections for the test interface of the device within the package 110.

Embodiments of the invention provide a method and apparatus for accessing test mode functionality of a device. In general, embodiments of the invention may be used with any type of device, including a device which is not included in a multi-chip package 110. In some cases, where embodiments of the invention are used with a device (e.g., a memory device 106) which is included in a multi-chip package 110, the embodiments may allow test mode functionality of the device to be accessed with limited or no access to a test mode interface of the device. Thus, even after a device has been placed in a multi-chip package 110, embodiments of the invention allow testing of the device.

Figure 2:
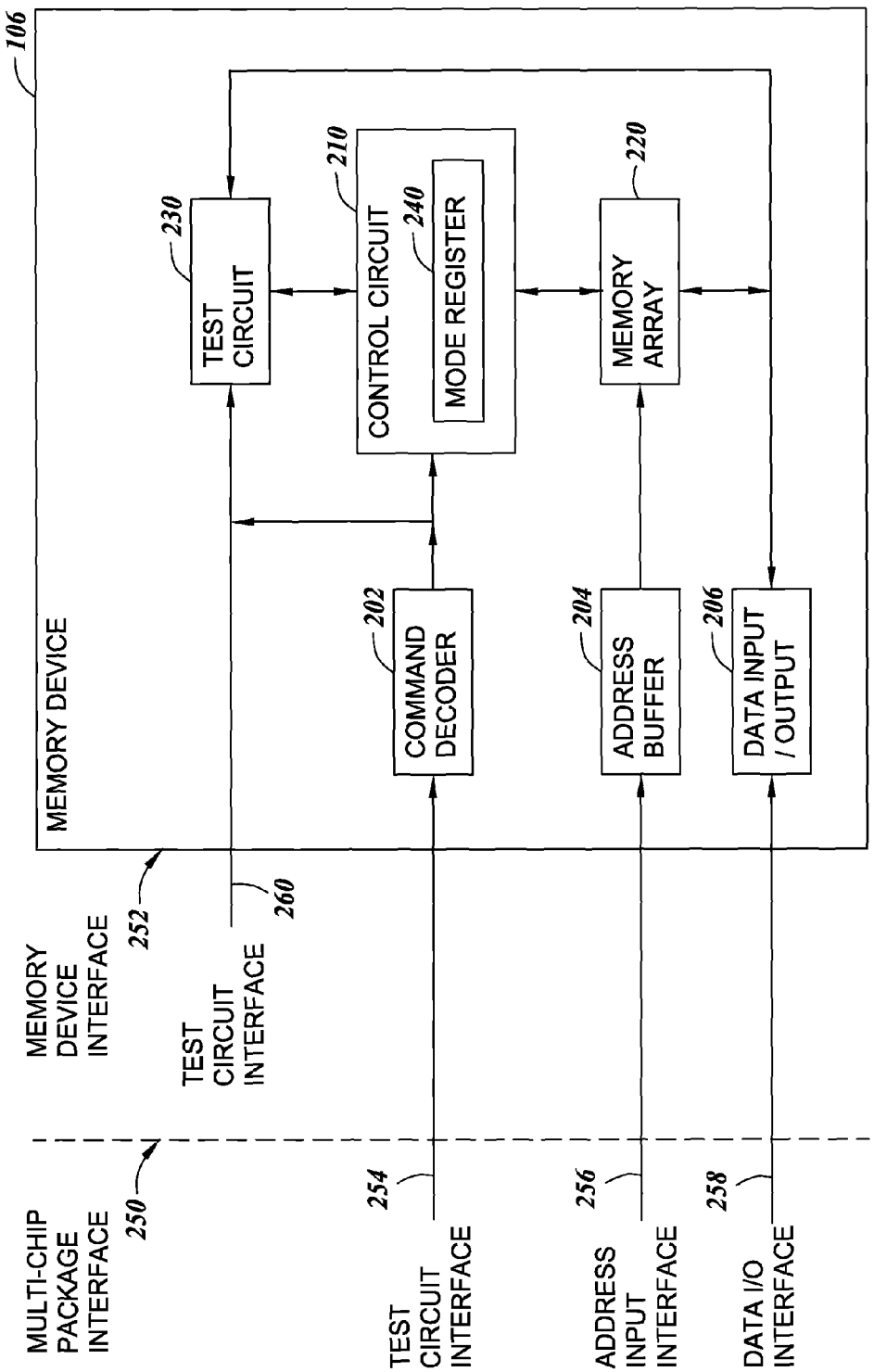
FIG. 2 is a block diagram depicting a memory device according to one embodiment of the invention.

FIG. 2 illustrates one embodiment of the invention in which a test mode of a memory device 106 may be activated without access to a test interface of the memory device 106. In one embodiment, the memory device 106 depicted in FIG. 2 may be a memory device in the multi-chip package 110 depicted in FIG. 1B. Optionally, the memory device 106 may be included in a package 106 as depicted in FIG. 1A. The memory device 106 may include one or more of any of the memory devices itemized above. In a particular embodiment, the memory device 106 may be a DRAM memory device.

As depicted, the memory device 106 may include a command decoder 202, address buffer 204, data input/output (I/O) circuit 206, and control circuit 210 which may be used to access a memory array 220. The command decoder 202 may receive commands for the memory device via a command input interface 254. For access commands (e.g., read commands, write commands, and activate commands), addresses may be received by an address buffer 204 via an address input interface 256 and data may be input and output by the data input/output circuit 206 via a data input/output interface 258. The control circuit 210 may receive decoded commands from the command decoder 202 and provide signals to other circuits in the memory device 106 which cause the commands to be performed.

The control circuit may also include one or more mode registers 240. For example, in a particular embodiment, the mode registers 240 may include a standard mode register (MR) and/or an extended mode register (EMR) which may be accessed and modified using a mode register set (MRS) command and extended mode register set (EMRS) command, respectively. In one embodiment, settings in the mode registers 240 may be used to configure how the memory device 106 operates. For example, the mode registers may be used to configure a burst length for burst accesses to the memory device 106.

In one embodiment of the invention, the memory device 106 may also include a test circuit 230 which may be configured to place the memory device 106 in a test mode. When the memory device 106 is in the test mode, the test circuit 230 may be configured to perform a built-in self test (BIST) of the memory device 106 and/or provide other testing support for the memory device 106. In one embodiment, testing may be performed while the memory device 106 is placed under increased stress, for example, by increasing the temperature of the memory device 106. Such tests performed under increased temperatures may be referred to as burn-ins. If a defect is detected, the test circuit 230 may be configured to repair the defect (e.g., the memory device 106 may be configured to perform self repairs). For example, if a wordline in the memory device 106 is defective, the test circuit 230 may be configured to replace the defective wordline with a redundant wordline.

In one embodiment of the invention, the test circuit 230 may be activated and/or controlled via a test circuit interface 260 which is accessible via the memory device interface 252. As depicted in FIG. 2, in some cases, where the memory device 106 is placed in a multi-chip package 110, the test circuit interface 260 may not be exposed externally to the multi-chip package 110 on the multi-chip package interface 250, while the command input interface 254, address input interface 256, and data input/output interface 258 may be exposed on both the memory device interface 252 and on the multi-chip package interface 250.

Embodiments of the invention provide for activation of a test mode, built in self-test, and/or self repair without access to a test circuit interface 260 for the test circuit 230. For example, such access may be provided via a command interface 254, address input interface 256, and/or data input/output interface 258 which are exposed on both the memory device interface 252 and the multi-chip package interface 250. In one embodiment, the test circuit interface 260 may be omitted entirely from the memory device interface 252. Optionally, as described above, the memory device interface 252 may include the test circuit interface 260 while the multi-chip package interface 250 may omit the test circuit interface. Where the test circuit interface 260 is omitted from either of the memory device interface 252 or the multi-chip package interface 250, the cost of the corresponding device may be reduced. Also, embodiments of the invention may be used where the memory device 106 is not placed in a multi-chip package 110 and/or where the multi-chip package interface 250 does provide access to the test circuit interface 260.

Figure 3A:
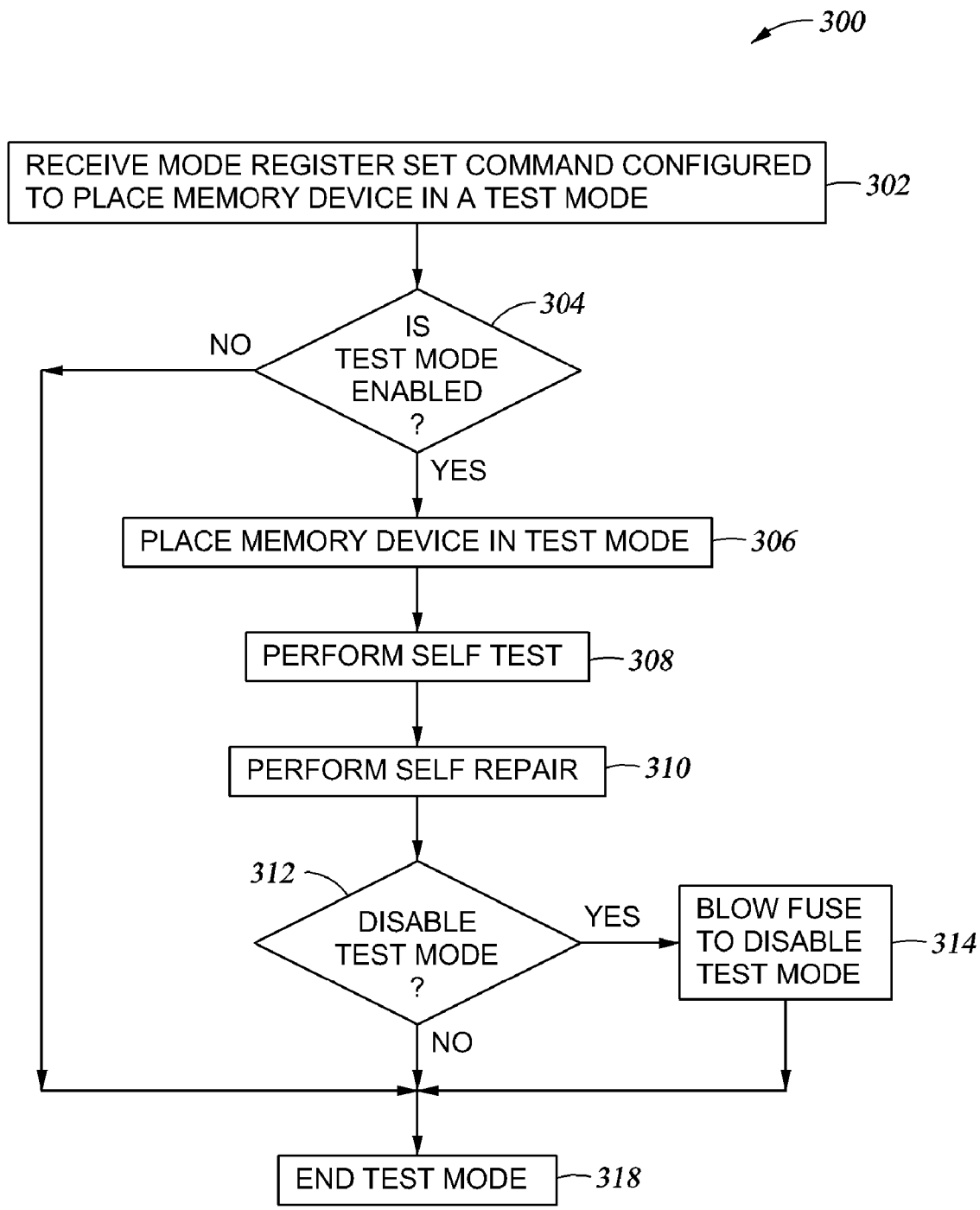
FIGS. 3A-B are block diagrams depicting methods for activating a test mode of a memory device according to one embodiment of the invention.

In one embodiment of the invention, the test circuit 230 may be activated and/or controlled by a mode register set (MRS) command issued to the memory device. The mode register set command may include the conventional MRS command as well as the extended MRS (EMRS) command for accessing mode registers 240 of the memory device 106. FIG. 3A is a block diagram depicting a process 300 for activating a test mode of the memory device 106 using a mode register set command according to one embodiment of the invention. As depicted, the process 300 begins at step 302 where a mode register set command is received. The command may be issued, for example, by the memory controller 104. The received mode register set command may be configured to place the memory device 106 in a test mode, for example, by setting or clearing a bit in a mode register of the memory device 106.

When the mode register set command is received, a determination may be made at step 304 of whether the test mode capabilities of the memory device 106 are enabled. For example, as described below, in some cases a fuse may be blown to permanently disable the test mode of the memory device 106 such that the memory device 106 cannot be placed in the test mode. If the test mode is enabled, then at step 306 the memory device 106 may be placed in the test mode. Then, at step 308, the memory device 106 may perform a self test, for example, using the test circuit 230. Then, at step 310, the memory device 310 may perform a self repair, if needed.

At step 312, a determination may be made of whether the test mode should be disabled. For example, in one embodiment, the memory device 106 may be automatically configured to disable the test mode after performing a self test. Optionally, additional mode register settings, additional commands, and/or additional interfaces may be used to disable the test mode. If a determination is made that the test mode should be disabled, then the test mode may be disabled at step 314, for example, by blowing a fuse. The fuse may be a laser blown fuse, an electrically blown fuse (e-fuse). Also, in some cases, other types of non-volatile memory may be used to store information indicating that the test mode is disabled. For example, a bit may be set or cleared in flash memory to disable the test mode.

At step 318, the test mode may end. For example, the memory device 106 may be automatically configured to exit the test mode. Optionally, the test mode may be ended by issuing additional mode register set commands to the memory device 106. Furthermore, with respect to each of the operations described herein, the memory device 106 may either be configured to automatically perform the operations (e.g., for steps 306, 308, and 310) or the memory device 106 may be configured to perform the operations in response to a command (e.g., a mode register set command) issued to the memory device 106.

In one embodiment, the test mode of the memory device 106 may be activated upon receiving one or more commands which match a predefined pattern of commands configured to place the memory device 106 in a test mode. The pattern may include commands types, addresses, and/or data provided by the commands. In some cases, data provided by the commands may be stored and/or used to configure test operations performed as a result of receiving the pattern of commands. In one embodiment, by using standard commands to activate the test mode of the memory device, including in cases where access to the memory device 106 is restricted, systems including the memory device 106 may be designed and tested without requiring extensive and/or expensive modifications of devices (e.g., memory controllers and/or processors) which interact with the memory device 106 to place the memory device in the test mode.

Figure 3B:
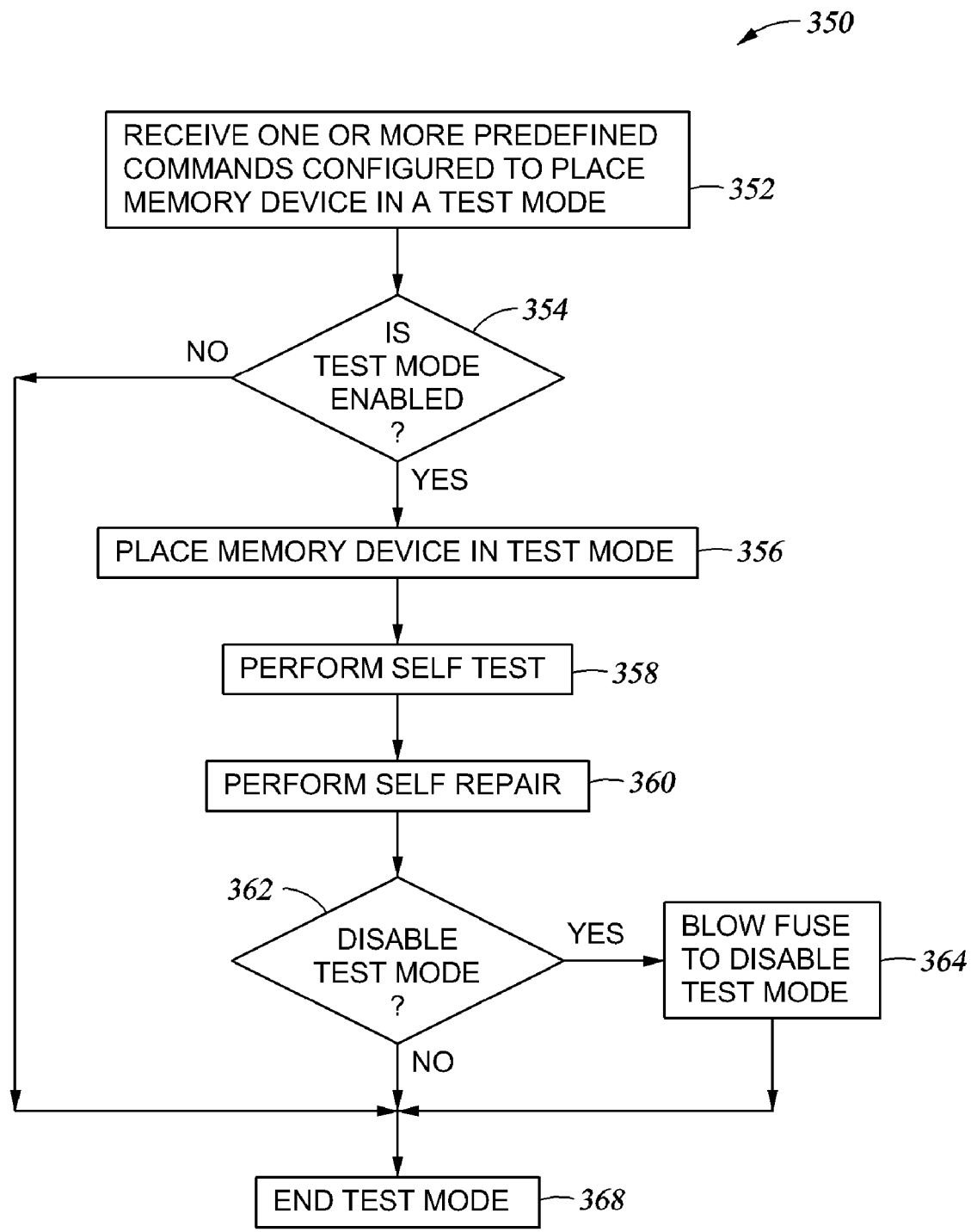

FIG. 3B is a block diagram depicting a process 350 for activating a test mode with one or more predefined commands according to one embodiment of the invention. The process 300 begins at step 352 where one or more predefined commands is received. The command may be issued, for example, by the memory controller 104 and/or by the processor 102 via the memory controller 104. The one or more predefined commands may be configured to place the memory device 106 in a test mode. For example, the test circuit 230 may continuously monitor commands received by the memory device 106. Upon detecting the one or more predefined commands, the test circuit 230 may place the memory device 106 in a test mode as described below.

The one or more predefined commands may include access commands such as read, write, and/or activate commands. For example, in one embodiment, a sequence of commands may be defined which, when received by the memory device 106, is configured to place the memory device 106 in the test mode. The sequence of predefined commands may include specific predefined addresses and/or data which are provided to place the memory device 106 in the test mode. For example, to activate the test mode, a sequence of write commands may be used to write predefined data to predefined addresses in the memory device 106.

In one embodiment, the length of the predefined sequence may be selected to prevent arbitrary commands issued during normal operation of the memory device 106 from inadvertently activating a test mode of the memory device. The test circuit 230 may monitor the addresses and/or data for each of the commands to determine whether received commands match the predefined sequence. In some cases, data written by the one or more commands may indicate what type of tests to perform, what type of self repair to perform, and other information to be used for testing the memory device 106.

When the one or more predefined commands are received, a determination may be made at step 354 of whether the test mode capabilities of the memory device 106 are enabled. If the test mode is enabled, then at step 356 the memory device 106 may be placed in the test mode. Then, at step 358, the memory device 106 may perform a self test, for example, using the test circuit 230. Then, at step 360, the memory device 360 may perform a self repair, if needed.

At step 362, a determination may be made of whether the test mode should be disabled. If a determination is made that the test mode should be disabled, then the test mode may be disabled at step 364, for example, by blowing a fuse or storing an indication in other non-volatile memory as described above. Where one or more predefined commands are used to place the memory device 106 in the test mode, disabling the test mode may be used, for example, to prevent the memory device 106 from inadvertently being placed in the test mode (e.g., where a sequence of commands issued to the memory device 106 inadvertently matches the predefined sequence). Then, at step 368, the test mode may end. For example, the memory device 106 may be automatically configured to exit the test mode.

In some cases, the memory device 106 may include additional circuitry to maintain the integrity of data stored within the memory device 106. For example, the memory device 106 may maintain error correction code (ECC) information for data stored in the memory device 106. The error correction code information may be used to detect and/or correct errors in data stored in the memory device 106. Also, in some cases, the memory device 106 may omit error correction code information. For example, where the memory device 106 includes self test and repair capability as described herein, the memory device 106 may not be configured to use the error correction code, thereby reducing the cost of the memory device 106.

As described above, in some cases, by using commands issued to the memory device to activate a test mode of the memory device, activation of the test mode may be achieved, even where access to a test interface of the memory device is restricted. Furthermore, in some cases, by using standard commands to activate the test mode of the memory device, systems including the memory device may be designed and tested without requiring extensive and/or expensive modifications of devices (e.g., memory controllers and/or processors) which interact with the memory device to place the memory device in the test mode.

While the foregoing is directed to embodiments of the present invention, other and further embodiments of the invention may be devised without departing from the basic scope thereof, and the scope thereof is determined by the claims that follow.

What is claimed is:

1. A method for operating a component including a memory device, the method comprising:
   receiving a plurality of commands;
   determining if a set of the plurality of commands matches a predefined pattern of commands configured to place the memory device into a test mode; and
   upon determining that the set of the plurality of commands matches the predefined plurality of commands placing the memory device in the test mode,
   wherein the memory device includes a dedicated test interface for placing the memory device in the test mode, and wherein the dedicated test interface is incapable of receiving data from an exterior interface of a multi-chip package in which the memory device is placed.

2. The method of claim 1, wherein the memory device is not configured to use error correcting code information.

3. The method of claim 1, wherein the memory device is placed in the test mode after the memory device is placed within a multi-chip package.

4. The method of claim 1, further comprising:
   preventing the memory device from being placed in a subsequent test mode by storing test setting information in non-volatile storage of the memory device.

5. The method of claim 1, wherein one of the commands is associated with at least one of an address and data to be stored on the memory device.

6. The method of claim 5, wherein determining if a set of the plurality of commands matches a predefined pattern of commands further comprises, determining if the at least one of associated address and data matches a predefined value of at least one of the address and data.

7. A method for operating a component including a dynamic random access memory (DRAM) device, the method comprising:
   receiving, at a command interface of the DRAM device, a mode register set command configured to place the DRAM device in a test mode; and
   in response to receiving the command to set the mode register of the memory device, placing the memory device in the test mode,
   wherein the memory device includes a dedicated test interface for placing the memory device in the test mode, and wherein the dedicated test interface is incapable of receiving data from an exterior interface of a multi-chip package in which the memory device is placed.

8. The method of claim 7, wherein the memory device is not configured to use error correcting code information.

9. The method of claim 7, wherein the memory device is placed in the test mode after the memory device is placed within a multi-chip package.

10. The method of claim 7, further comprising:
    preventing the memory device from being placed in a subsequent test mode by storing test setting information in non-volatile storage of the memory device.

11. The method of claim 7, wherein one of the commands is associated with at least one of an address and data to be stored on the memory device.

12. The method of claim 11, wherein receiving, at a command interface of the DRAM device, a mode register set command configured to place the DRAM device in a test mode further comprises, receiving the at least one of associated address and data configured to place the DRAM device in a test mode.

13. A method for operating a component including a memory device, the method comprising:
    receiving one or more commands including at least one of a read command, an activate command, and a write command;
    determining if the one or more commands matches one or more predefined commands configured to place the memory device into a test mode; and
    upon determining that the one or more commands matches the one or more predefined commands, placing the memory device in the test mode,
    wherein the memory device includes a dedicated test interface for placing the memory device in the test mode, and wherein the dedicated test interface is incapable of receiving data from an exterior interface of a multi-chip package in which the memory device is placed.

14. The method of claim 13, wherein the memory device is not configured to use error correcting code information.

15. The method of claim 13, wherein the memory device is placed in the test mode after the memory device is placed within a multi-chip package.

16. The method of claim 13, further comprising:
    preventing the memory device from being placed in a subsequent test mode by storing test setting information in non-volatile storage of the memory device.

17. The method of claim 13, wherein one of the commands is associated with at least one of an address and data to be stored on the memory device.

18. The method of claim 17, wherein determining if a set of the plurality of commands matches a predefined pattern of commands further comprises, determining if the at least one of associated address and data matches a predefined value of at least one of the address and data.

19. A memory device, comprising:
one or more memory arrays;
circuitry configured to:
  receive a plurality of commands;
  determine if a set of the plurality of commands matches a predefined pattern of commands configured to place the memory device into a test mode in which the one or more memory arrays are tested; and
  upon determining that the set of the plurality of commands matches the predefined plurality of commands, place the memory device in the test mode,
  wherein the memory device includes a dedicated test interface for placing the memory device in the test mode, and wherein the dedicated test interface is incapable of receiving data from an exterior interface of the memory device.

20. The memory device of claim 19, wherein the memory device is not configured to use error correcting code information.

21. The memory device of claim 19, wherein the circuitry is further configured to:
  prevent the memory device from being placed in a subsequent test mode by storing test setting information in non-volatile storage of the memory device.

22. The method of claim 19, wherein one of the commands is associated with at least one of an address and data to be stored on the memory device, and wherein upon determining that the set of the plurality of commands matches the predefined plurality of commands further comprises, determining if the at least one of associated address and data matches a predefined value of at least one of the address and data.

23. A multi-chip package comprising:
a memory device comprising:
  one or more memory arrays;
  circuitry configured to:
    receive a plurality of commands;
    determine if a set of the plurality of commands matches a predefined pattern of commands configured to place the memory device into a test mode in which the one or more memory arrays are tested; and
    upon determining that the set of the plurality of commands matches the predefined plurality of commands place the memory device in the test mode,
    wherein the memory device includes a dedicated test interface for placing the memory device in the test mode, and wherein the dedicated test interface is incapable of receiving data from an exterior interface of the multi-chip package.

24. The multi-chip package of claim 23, wherein the memory device is not configured to use error correcting code information.

25. The multi-chip package of claim 23, wherein the circuitry is further configured to:
  prevent the memory device from being placed in a subsequent test mode by storing test setting information in non-volatile storage of the memory device.

26. The multi-chip package of claim 23, wherein one of the plurality of commands is associated with at least one of an address and data to be stored on the memory device.

27. The multi-chip package of claim 26, wherein determining that the set of the plurality of commands matches the predefined plurality of commands further comprises, determining that the at least one of associated address and data matches a predefined value of at least one of the address and data.

* * * * *